(12) United States Patent
Bergman et al.

(10) Patent No.: US 10,971,354 B2
(45) Date of Patent: *Apr. 6, 2021

(54) DRYING HIGH ASPECT RATIO FEATURES

(71) Applicant: Applied Materials Inc., Santa Clara, CA (US)

(72) Inventors: Eric J. Bergman, Kalispell, MT (US); John L. Klocke, Kalispell, MT (US); Paul McHugh, Kalispell, MT (US); Stuart Crane, Kalispell, MT (US); Richard W. Plavidal, Kalispell, MT (US)

(73) Assignee: Applied Materials, Inc., Santa Clara, CA (US)

(*) Notice: Subject to any disclaimer, the term of this patent is extended or adjusted under 35 U.S.C. 154(b) by 317 days.

This patent is subject to a terminal disclaimer.

(21) Appl. No.: 15/650,140

(22) Filed: Jul. 14, 2017

(65) Prior Publication Data

US 2018/0019119 A1 Jan. 18, 2018

Related U.S. Application Data

(60) Provisional application No. 62/362,891, filed on Jul. 15, 2016.

(51) Int. Cl.
*C30B 33/00* (2006.01)
*H01L 21/02* (2006.01)
(Continued)

(52) U.S. Cl.
CPC ...... *H01L 21/02101* (2013.01); *B08B 7/0021* (2013.01); *B08B 7/0035* (2013.01);
(Continued)

(58) Field of Classification Search
CPC .................................................... C30B 33/00
See application file for complete search history.

(56) References Cited

U.S. PATENT DOCUMENTS 5,685,086 A 11/1997 Ferrell
5,715,612 A 2/1998 Schwenkler
(Continued)

FOREIGN PATENT DOCUMENTS

JP 3471543 B2 12/2003
JP 2004-119591 A 4/2004
(Continued)

OTHER PUBLICATIONS

International Search Report and Written of PCT/US2017/042071 dated Sep. 29, 2017, all pages.
(Continued)

*Primary Examiner* — Robert M Kunemund
(74) *Attorney, Agent, or Firm* — Kilpatrick Townsend & Stockton LLP

(57) ABSTRACT

Methods of drying a semiconductor substrate may include applying a drying agent to a semiconductor substrate, where the drying agent wets the semiconductor substrate. The methods may include heating a chamber housing the semiconductor substrate to a temperature above an atmospheric pressure boiling point of the drying agent until a vapor-liquid equilibrium of the drying agent within the chamber has been reached. The methods may further include venting the chamber, where the venting vaporizes the liquid phase of the drying agent from the semiconductor substrate.

20 Claims, 3 Drawing Sheets

(51) Int. Cl.
*F26B 21/14* (2006.01)
*B08B 7/00* (2006.01)
*F26B 5/00* (2006.01)

(52) U.S. Cl.
CPC ............ *F26B 5/005* (2013.01); *F26B 21/145* (2013.01); *H01L 21/02046* (2013.01); *H01L 21/02054* (2013.01); *H01L 21/02057* (2013.01); *H01L 21/02082* (2013.01); *H01L 21/02096* (2013.01); *H01L 21/02661* (2013.01)

(56) References Cited

U.S. PATENT DOCUMENTS

| | | |
|---|---|---|
| 5,953,832 A | 9/1999 | Rosynsky et al. |
| 6,026,588 A | 2/2000 | Clark et al. |
| 6,067,727 A | 5/2000 | Muraoka |
| 6,212,789 B1 | 4/2001 | Kato et al. |
| 6,745,494 B2 * | 6/2004 | Bergman .......... H01L 21/67028 34/410 |
| 6,802,137 B1 | 10/2004 | Gray |
| 7,181,863 B2 | 2/2007 | Ferrell et al. |
| 7,437,834 B2 | 10/2008 | Nakatsukasa et al. |
| 7,637,029 B2 | 12/2009 | Kamikawa et al. |
| 9,662,685 B2 | 5/2017 | Goshi et al. |
| 9,829,249 B2 | 11/2017 | Tice |
| 10,246,240 B1 | 4/2019 | Sadaghiani |
| 10,347,511 B2 | 7/2019 | Verhaverbeke et al. |
| 2011/0139183 A1 * | 6/2011 | Mikhaylichenko .......................... H01L 21/02057 134/18 |
| 2011/0314689 A1 | 12/2011 | Okuchi et al. |
| 2012/0103371 A1 | 5/2012 | Yun et al. |
| 2012/0260517 A1 | 10/2012 | Lenz et al. |
| 2014/0144462 A1 * | 5/2014 | Verhaverbeke ... H01L 21/67034 134/1.2 |
| 2014/0283882 A1 | 9/2014 | Kimura et al. |
| 2014/0298669 A1 * | 10/2014 | Jeong ................ H01L 21/02057 34/60 |
| 2016/0238580 A1 * | 8/2016 | Kundalgurki ...... G01N 33/0062 |
| 2018/0144954 A1 | 5/2018 | Bergman et al. |

FOREIGN PATENT DOCUMENTS

| | | |
|---|---|---|
| JP | 2015092538 A | 5/2015 |
| JP | 2015-233108 A | 12/2015 |
| KR | 10-2013-0138122 A | 12/2013 |
| KR | 10-2015-0088829 a | 8/2015 |
| KR | 10-2015-0122008 A | 10/2015 |

OTHER PUBLICATIONS

International Preliminary Report on Patentability dated May 31, 2019 in International Patent Application No. PCT/US2017/062068, all pages.

International Search Report and Written Opinion dated Jan. 31, 2018 in International Patent Application No. PCT/US2017/062068, all pages.

* cited by examiner

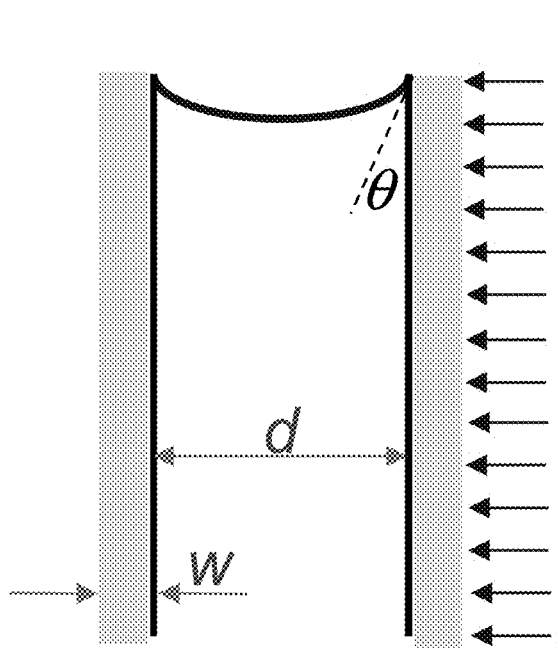
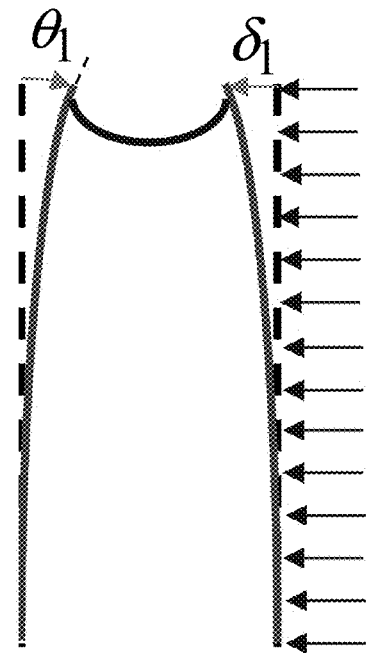
FIG. 1A    FIG. 1B
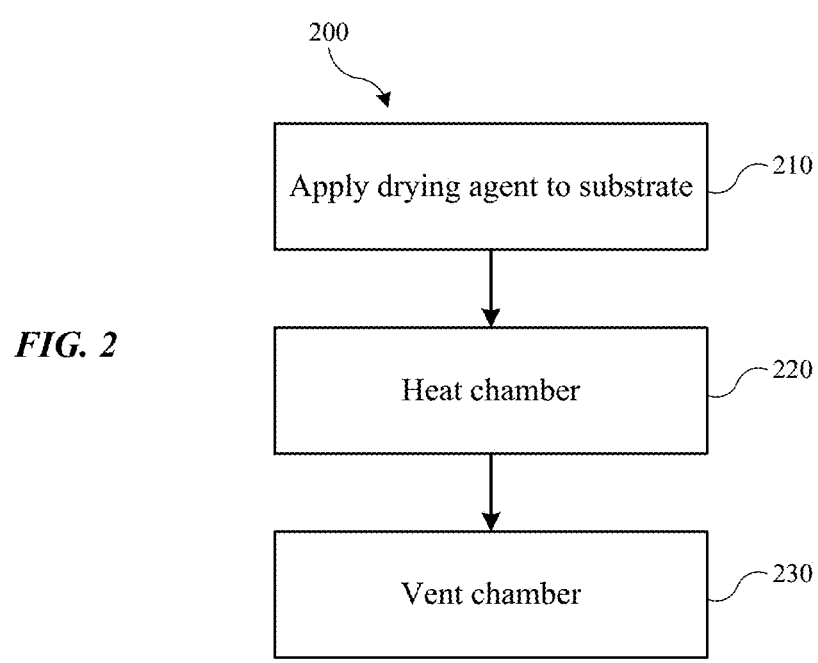
FIG. 2

DRYING HIGH ASPECT RATIO FEATURES

CROSS-REFERENCE TO RELATED APPLICATIONS

This application claims priority to U.S. Provisional Patent Application No. 62/362,891 filed on Jul. 15, 2016 entitled "DRYING HIGH ASPECT RATIO FEATURES," which is incorporated herein by reference in its entirety for all purposes.

TECHNICAL FIELD

The present technology relates to drying materials having high aspect ratio features. More specifically, the present technology relates to cleaning and drying materials having high aspect ratio features to reduce pattern collapse or deformation of delicate features.

BACKGROUND

Integrated circuits are made possible by processes which produce intricately patterned material layers on substrate surfaces. Producing patterned material on a substrate requires controlled methods for applying and removing material. For removal, chemical or physical etching may be performed for a variety of purposes including transferring a pattern in photoresist into underlying layers, thinning layers, or thinning lateral dimensions of features already present on the surface. Once a material has been etched or otherwise processed, the substrate or material layers are cleaned or prepared for further operations.

Cleaning processes may use many different agents for different processes. These processes can involve stripping materials, cleaning processed layers or patterns, removing particulates, or preparing substrates for a subsequent process. As device features continue to shrink in the nanometer range, pattern collapse due to properties of the cleaning fluids may become an issue. For example, water used as a cleaning agent may cause issues due to its high surface tension, which can cause substrate features to stress or deform. The smaller the device feature, the greater the impact water and other fluids may exhibit on the structure.

Thus, there is a need for improved systems and methods that can be used to produce high quality devices and structures. These and other needs are addressed by the present technology.

SUMMARY

Systems and methods of drying a semiconductor substrate may include applying a drying agent to a semiconductor substrate, where the drying agent wets the semiconductor substrate. The methods may include heating a chamber housing the semiconductor substrate to a temperature above an atmospheric pressure boiling point of the drying agent until vapor-liquid equilibrium of the drying agent has been reached within the chamber. The methods may further include venting the chamber, where the venting vaporizes the liquid phase of the drying agent from the semiconductor substrate.

The methods of drying a semiconductor substrate may also include pressure-sealing the semiconductor substrate within the chamber, and then forming a vapor-liquid equilibrium of the drying agent within the chamber. The methods may also include continuing to heat the chamber housing the semiconductor substrate to a temperature of at least about 100° C. after vapor-liquid equilibrium of the drying agent has been reached. In embodiments the drying agent may be miscible with water, and may, for example, be or include isopropyl alcohol. The semiconductor substrate may define patterned features having an aspect ratio greater than 5, and the drying agent may wet the patterned features completely.

Applying the drying agent may fully displace water from the semiconductor substrate. Additionally, applying the drying agent may include one or more operations fully displacing any fluid except for the drying agent from the semiconductor substrate. The heating operation may include hermetically closing the chamber with the rinsed semiconductor substrate housed within the chamber. The heating operation may also include heating the chamber to develop equilibrium between liquid and vapor phases of the drying agent. The heating operation may still further include heating the chamber to the temperature above the atmospheric pressure boiling point of the drying agent. The method may also include optionally purging the chamber with an inert precursor subsequent the venting.

The present technology may also include additional methods of drying a semiconductor substrate including applying a drying agent to the semiconductor substrate. The drying agent may wet the semiconductor substrate or may cover the substrate features in embodiments. The methods may include heating a chamber in which the semiconductor substrate is housed to develop equilibrium between liquid and vapor phases of the drying agent. The heating may maintain at least a portion of the drying agent in a liquid form, and may maintain sufficient liquid to cover features defined within the substrate. The methods may also include exposing the chamber to vacuum conditions where the vacuum conditions evaporate and purge the drying agent from the chamber.

The heating operation of the drying methods may be performed to a temperature below about 150° C. The methods may further include, subsequent exposing the chamber to vacuum, venting the chamber to atmospheric conditions. In some embodiments the methods may also include purging the chamber with air or an inert gas. The drying agent used in the method may include isopropyl alcohol or acetone. Additionally, exposing the chamber to vacuum conditions may include reducing the pressure within the chamber from atmospheric conditions to a pressure of less than about 100 Torr. Reducing the pressure within the chamber may occur in a time period of less than about 5 minutes.

The present technology may also include additional methods of drying a substrate. The methods may include applying a drying agent to the substrate, where the drying agent wets the substrate. The methods may include hermetically sealing a chamber housing the substrate, and may include forming a vapor-liquid equilibrium of the drying agent within the chamber. The methods may further include increasing the temperature within the chamber to reduce the drying agent surface tension for a liquid fraction of the drying agent below a predetermined threshold. The methods may also include depressurizing the chamber, wherein the depressurizing substantially removes liquid drying agent from the substrate. In embodiments, the predetermined threshold may include a drying agent surface tension of about 20 mN/m. The substrate may include or define a plurality of patterned features characterized by an aspect ratio greater than 5. Applying the drying agent may include coating the substrate with the drying agent above a height of the patterned features, and in embodiments the drying agent may be characterized by a surface tension of less than about 25 mN/m at about 21° C.

Such technology may provide numerous benefits over conventional technology. For example, the present devices may reduce pattern deformation across an entire surface of the substrate due to a more uniform removal process. Additionally, the improved methodology may reduce queue times by limiting a number of internal processing steps utilized by other conventional cleaning technologies. These and other embodiments, along with many of their advantages and features, are described in more detail in conjunction with the below description and attached figures.

BRIEF DESCRIPTION OF THE DRAWINGS

A further understanding of the nature and advantages of the disclosed embodiments may be realized by reference to the remaining portions of the specification and the drawings.

FIG. 1A shows a representation of the effects of a fluid within a trench according to embodiments of the present technology.

FIG. 1B shows a representation of the effects of fluid within a trench as the trench walls begin to deform according to embodiments of the present technology.

FIG. 2 shows a method of drying a semiconductor substrate according to embodiments of the present technology.

Figure 3:
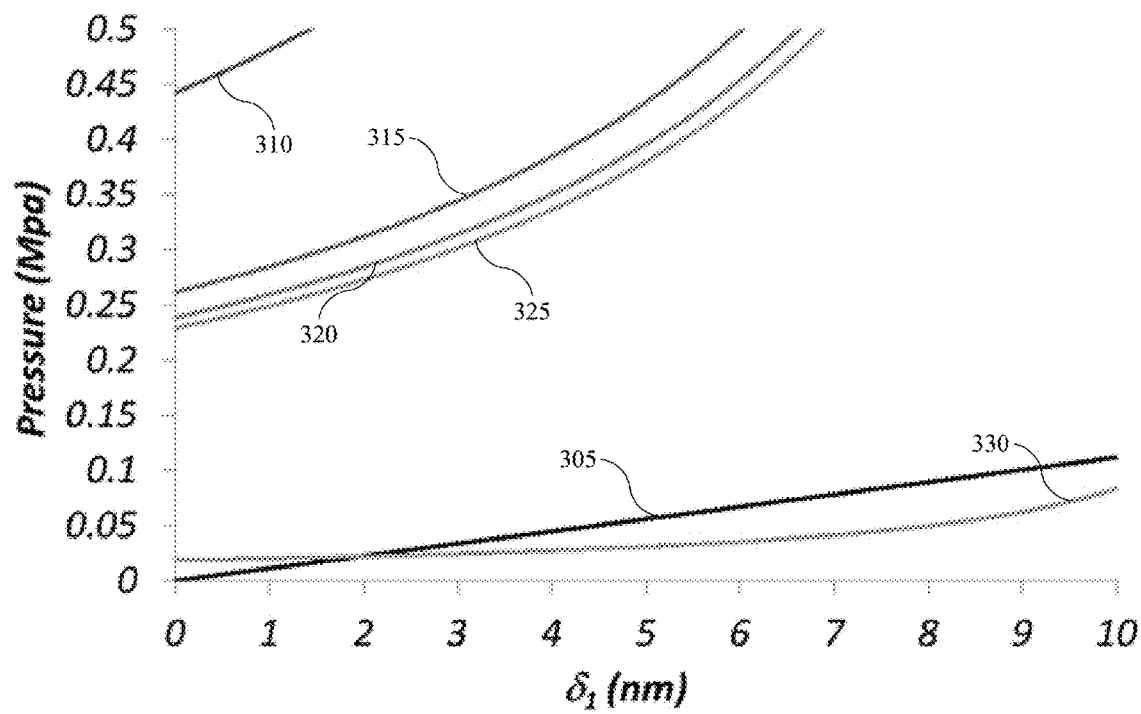
FIG. 3 shows a chart illustrating different fluid surface tension properties according to embodiments of the present technology.

In the figures, similar components and/or features may have the same numerical reference label. Further, various components of the same type may be distinguished by following the reference label by a letter that distinguishes among the similar components and/or features. If only the first numerical reference label is used in the specification, the description is applicable to any one of the similar components and/or features having the same first numerical reference label irrespective of the letter suffix.

DETAILED DESCRIPTION

During many different stages of semiconductor processing, work surfaces and materials are cleaned. The cleaning processes may involve wet etches, rinses, and drying processes to remove unwanted residues and fluids from a substrate. Cleaning processes may happen in incremental operations beginning with one fluid and rinsing with one or more other fluids until the device is clean and dry. Water is used in many cleaning processes due to its solvent capabilities for a host of materials. Often, the water is then removed with a combination of processes that may include heat and other fluids.

Device patterning and features that continue to shrink in dimension may include delicate features etched or formed on a substrate. For example, many processing operations may work upon or form trenches in a substrate or materials on a substrate. The aspect ratio, defined as the height to width ratio, may be very high in devices, and can be on the order of 5, 10, 20, 50, 100 or greater. Many of these features may have not only high aspect ratios, but also reduced dimensions on the scale of a few nanometers, for example. For example, the width of any particular column or wall between two trenches may be of only a few nanometers. The thinner is this material, the more impact stresses may pose on the integrity of the structure. Additionally, the material composing the structure may also impact the effect of exerted pressures or stresses on the material, be it a substrate material, dielectric, photo-resist, etc.

Issues may arise when delicate, high-aspect-ratio features are cleaned, because the cleaning fluids may exhibit surface tensions that may be much higher than can be managed by the features. In designs having multiple features, layers, or materials, even a small amount of feature deformation or collapse can cause short circuits through the produced device rendering it inoperable. For example, water is very useful as a solvent, but it naturally exhibits a surface tension that can readily damage features on a substrate. Many conventional technologies may attempt to control this issue by performing rinses with materials having a lower surface tension than water, or by performing complicated processes of removal. One promising technology for fluid removal in cleaning operations is by performing drying operations with super-critical fluids. Although these techniques may provide surfaces that are drier and less prone to pattern collapse, the amount of preparation and the number of operations involved may reduce the efficiency of overall substrate processing.

An exemplary process may aid in the understanding of the issues relating to pattern collapse, and is described here: In a general process, a substrate may be exposed to one or more cleaning agents including acids, bases, or other reactive fluids or precursors. At least one rinsing operation may also be performed that may include water in an embodiment of the technology. The water may be used in a bath, a spray, or in some other rinsing operation that may utilize the water to remove another cleaning agent, and which may cause water to be incorporated within features, including high-aspect-ratio features. Because water readily dissolves a great variety of substances, it may be used in any number of cleaning processes in order to remove additional chemicals used on a substrate.

In order to remove the water from the substrate, any number of operations may be performed, from evaporating the water to performing a rinse. For substrates having features with a high aspect ratio, small pillars, or other delicate features, evaporating the water may cause a number of problems. These features may be capable of withstanding Laplace pressures of up to a few tenths of an MPa or less. Water, however, is characterized by a surface tension at room temperature, or about 21° C. to 25° C., of roughly 73 mN/m, or a Laplace pressure of several MPa, which can be over an order of magnitude higher than the capabilities of the substrate features. Additionally, the water may provide additional issues as it is removed from features such as trenches.

A semiconductor substrate may have a series of trenches formed that may, as part of a cleaning process, be cleaned with water or other fluids. As the water or other fluid is removed from the substrate and trenches, a meniscus may form within each trench as illustrated in FIG. 1. The meniscus may be characterized by a Laplace pressure within the fluid, and is related to the surface tension of the fluid, the contact angle θ, and the width of the trench d. Put another way, a pressure drop may form across the meniscus applying tension to the walls that increases along the meniscus. There may also be a surface tension force of the fluid along the contact with the trench walls as well as the air above the meniscus. These pressures may be several MPa and cannot be managed by the restoring force or internal restrictive stresses within the trench walls. Accordingly, the walls may begin to deform inwardly in response to the forces acting upon them, as illustrated in FIG. 1B. However, as the pattern deforms and the geometry adjusts, the Laplace pressures may actually increase, further compounding the issues and leading to pattern collapse.

Theoretically, if structured trenches all maintain an equal amount of fluid within the trench to be removed, the pressures will remain constant on both sides of the features and balance the forces. However, as fluids begin to evaporate, even minor differences between the trenches can affect how much fluid is removed from an individual trench. Even a small difference in fill level between adjacent trenches can begin the runaway process described above as the forces become imbalanced.

Conventional wisdom may lead to seeking fluids that have lower surface tensions alone, and then performing similar rinsing and drying operations to displace water and dry the substrate. The present technology, however, performs a combination drying technique that follows the boiling point curve of a drying agent at a vapor-liquid equilibrium to more uniformly evaporate or remove the drying agent. By utilizing the surface tension properties of the drying agent along with its evaporation characteristics, improved drying agent removal may be achieved. Thus, the inventors have determined that by combining relatively lower surface tension fluids with a temperature-based removal process, surface tension effects can be reduced and more readily managed. Consequently, and advantageously, many more fluids than previously believed may be utilized in the rinsing and drying processes despite exhibiting higher surface tensions.

Although the remaining portions of the specification will routinely reference semiconductor processing, the present techniques should not be considered limited to semiconductors. For example, many microfluidic technologies may benefit from the processes and operations described below. Microfluidics relates to the manipulation of fluids in the range of microliters or smaller within channels that may have dimensions in the nanometer range. Due to the nature of materials at such dimensions, channel deformation may similarly pose issues that may be improved or resolved by the present technology. Accordingly, the present technology should not be considered so limited to the processing and manufacturing of semiconductors, as it may equally apply to a host of technologies that may involve pattern deformation or collapse issues.

Turning to FIG. 2 is shown a method 200 of drying a semiconductor substrate according to embodiments of the present technology. The method may involve applying a drying agent to a semiconductor substrate at operation 210. Although the operations of the method may begin at operation 210, it is to be understood that one or more optional operations may be performed prior to the application operation. For example, any number of patterning and cleaning operations may be performed leading to a rinsing operation. The cleaning operations may utilize one or more acids, bases, inert fluids, or other precursors for cleaning and removal. Exemplary substances that may be used in cleaning operations may include one or more of solutions of hydrofluoric acid, solutions of hydrochloric acid, solutions of hydrogen peroxide, solutions of ammonium hydroxide, solutions of sulfuric acid, as well as other acid and basic materials. Combinations of agents may also be used in embodiments such as, for example, APM, which is a mixture of ammonium hydroxide, hydrogen peroxide, and water, and which can be useful in removing particulates from substrate surfaces.

After cleaning agents have been applied, a water rinse may be performed to remove these reactive species and further clean the substrate. This water may then be removed with a drying agent in operation 210. The application of the drying agent may be used to remove some, substantially all, or all water from the substrate, including within trenches and other features that have been formed. The application may be performed with a bath in which the substrate is submerged and optionally agitated. The drying agent may also be sprayed, applied in a dip, or otherwise coated or applied onto the substrate. Any number of mechanisms may be utilized that may use a drying agent to displace water or other fluids from the substrate. In embodiments the drying agent may wet the semiconductor substrate, and may at least partially fill trenches formed within the substrate, or may completely fill trenches formed within the substrate to fully displace any fluid except for the drying agent from the semiconductor substrate. The amount of drying agent used may be variable based on factors including the size of the substrate, and amount of free space within the chamber. For example, a 300 mm substrate will generally not require as much drying agent to fully wet the substrate as a 450 mm substrate. Similarly, the less patterned a substrate, and the less surface area exposed, may also use less drying agent to fully wet the substrate in comparison to a substrate including complicated feature patterns.

As will be explained further below, the amount of drying agent associated with the substrate in the chamber may be to ensure that the substrate maintains at least a minimum volume of liquid drying agent, and does not completely evaporate. For example, if the drying agent, which may include volatiles, begins to evaporate at atmospheric conditions before being placed within a chamber, dry spots may emerge within trenches or along parts of the substrate. These dry spots may allow regions still wetted to have unbalanced forces acted upon their walls, which may cause deformation and pattern collapse. Accordingly, the amount of drying agent associated with the substrate when entered into a chamber may be sufficient to maintain the substrate fully or completely wetted. However, too much drying agent may also be an issue, such as if the substrate is within a bath of drying agent, or is fully submerged in drying agent when placed within a chamber. When a pressure adjustment, such as venting, is performed within a chamber housing the substrate, too much liquid within the system may cause the liquid to not be completely evaporated or withdrawn from the system before a return to atmospheric conditions. Remaining liquid drying agent within any features or trenches on the substrate may produce feature deformation or pattern collapse. Thus, a fully wetted substrate having a minimum of excess liquid agent covering exposed surfaces of the substrate may provide protection against the development of dry spots, while maintaining a minimum volume of drying agent to ensure proper removal.

The drying agent application operation 210 may be performed within a substrate chamber, or alternatively may be performed prior to providing the substrate into the chamber. Applying the drying agent to the substrate outside of the chamber may facilitate complete removal of water or other fluids, although care may be taken to ensure the substrate remains wetted as it is transferred into the chamber. Applying the drying agent to the substrate within the chamber may facilitate ensuring that at least a portion of liquid drying agent is associated with the substrate, although chamber configuration may be adjusted to ensure that water or other fluids are removed from the chamber prior to sealing. This may occur by thoroughly applying the drying agent to the substrate as well as all surfaces along an interior of the chamber. The rinsing and drying agent application operations may occur at atmospheric conditions, or at conditions based on the characteristics of the drying agent. For example, a drying agent that is a vapor at atmospheric conditions may be applied under vacuum, or at reduced temperatures to ensure at least a portion of the drying agent is liquid and completely wets the substrate.

Once the substrate is housed within a chamber, the chamber may be closed and heat may be applied to the chamber, or to a platform on which the substrate is seated in operation 220. The chamber may be hermetically sealed or pressure sealed in embodiments to ensure a pressure-tight vessel, and a variety of chamber configurations may be adequate for the process 200, and which may provide a pressure-tight vessel. The chamber may be of a sufficient thermal mass to provide heat retention within the vessel during the heating operation. Such a vessel may provide more consistent outcomes between wafers, for example, if it has more defined or controlled heat profiles during heating operations. The chamber may also be of a volume based on the wafer size being processed, e.g. a 300 mm, 450 mm, or 600 mm wafer. The amount of drying agent used may also be determined based on an amount of free space within the chamber. An amount of drying agent may be utilized that will allow a vapor-liquid equilibrium to develop within the chamber, without fully vaporizing the drying agent.

The heating operation 220 may be performed to cause vaporization of the drying agent to occur, and to form or develop a vapor-liquid equilibrium of the drying agent within the closed vessel at atmospheric pressure or slightly above atmospheric pressure. Put another way, the heating may initially cause an amount of evaporation of the drying agent on the substrate. This may be performed up to or beyond a temperature and pressure at which the vapor and liquid phases of the drying agent reach equilibrium of vapor partial pressure and liquid saturation pressure. Heat may then continue to be applied to raise the temperature above the atmospheric boiling point of the drying agent, while maintaining the equilibrium reached as the temperature and pressure continue to rise within the chamber. The heat applied may be based on the boiling point of the drying agent, for example, or may be at a low level temperature to develop a fraction of vapor. For example, the temperature within the vessel may be raised to about 25° C., about 30° C., about 35° C., about 40° C., about 45° C., about 50° C., about 60° C., about 70° C., about 80° C., about 90° C., or about 100° C. in embodiments. Once vapor-liquid equilibrium has been achieved, heat may continue to be applied during operation 220 to a temperature above the atmospheric pressure boiling point of the drying agent. For example, the temperature may be raised to above or about 100° C., above or about 110° C., above or about 120° C., above or about 130° C., above or about 140° C., above or about 150° C., above or about 160° C., above or about 170° C., above or about 180° C., above or about 190° C., above or about 200° C., or higher in embodiments, and depending on the characteristics of the drying agent.

Vapor-liquid equilibrium of the drying agent may be maintained during this heating as the pressure rises within the chamber along with the temperature. The temperature at which the chamber may be heated during operation 220 may be predetermined based on characteristics of the drying agent. Temperature is directly related, and inversely proportional, to the surface tension of most materials. Accordingly, as the temperature of a fluid increases, the surface tension decreases. By decreasing the surface tension of the drying agent within the chamber, the drying agent forces acting upon the substrate features may be reduced. Because the drying agent is maintained at vapor-liquid equilibrium during the heating process, the drying agent may not boil unnecessarily within the features of the substrate.

At a designated or predetermined temperature, the chamber may be vented or depressurized at operation 230. As the chamber is returned to atmospheric pressures, the fluid may vaporize within the chamber. Based on the temperature and pressure within the vessel, the vaporization may be rapid or substantially instantaneous upon venting. The venting may be performed in a step-wise manner, or may be reduced to atmospheric conditions more quickly. For example, a pressure-relief valve may be opened, which may begin the boiling process. The release may be slow to cause a gradual vaporization and release of the drying agent, or may be quick to obtain a more instantaneous conversion of liquid to vapor. For example, the venting may occur or be performed over a period of time that may be less than or about 30 minutes in embodiments. The amount of time may also be less than or about 25 minutes, less than or about 20 minutes, less than or about 15 minutes, less than or about 10 minutes, less than or about 5 minutes, less than or about 1 minutes, less than or about 30 seconds, less than or about 15 seconds, less than or about 10 seconds, or less in embodiments. By utilizing a high-temperature, high-pressure conversion, the present technology may produce a more uniform vapor conversion of drying agent across the surface, and within the features, of the substrate. In this way, surface tension effects on the substrate features may be controlled during the drying operation in which the drying agent is removed from the surface of the substrate. Optionally, the chamber may be purged with air, or an inert fluid including nitrogen, argon, or helium, for example, to ensure the substrate is fully dry and drying agent condensate does not reform on the substrate.

Exemplary substrates may encompass materials used in semiconductor processing, microfluidic devices, implantable devices, and many more materials that may have features of micro or nanometer dimensions. For semiconductor substrates, the substrate may be or include silicon, germanium, gallium, carbon, arsenic, selenium, tellurium, or materials or combinations of elements from Groups 13, 14, or 15 of the periodic table. For other devices, plastics, polymers, ceramics, and other metal and non-metal structures may form the substrates or substrate features. Exemplary features may include patterns including steps, vias, trenches, channels, or other designs that may be characterized by aspect ratios of greater than or about 1, 2, 3, 4, 5, 6, 7, 8, 9, 10, 12, 14, 16, 18, 20, 22, 25, 30, 35, 40, 45, 50, 60, 70, 80, 90, 100, or higher in embodiments. Features may include trenches having any of the aspect ratios discussed or a range of aspect ratios composed of or including any of the values or intervening values listed above. Trenches may also be characterized by a gap between trenches that may be less than or about 100 nm, 80 nm, 60 nm, 50 nm, 45 nm, 40 nm, 35 nm, 30 nm, 25 nm, 20 nm, 15 nm, 10 nm, 5 nm, 1 nm, or less. The features may also be defined by a wall, pillar, or pillar-like structure which may be characterized by a height of less than or about 10 micrometers, as well as by a length, width, or diameter of any of the sizes noted above. Spacing between pillar or other vertical structures may also be similar to the sizes noted above.

Exemplary drying agents may be polar or non-polar, and may include several different chemical formulas. The drying agents may include fluids that are miscible with water, or produce at least partial solutions with water. Drying agents according to the present technology may include carbon-containing compounds, halogen-containing compounds, or other natural or manufactured fluids that may be useful to the removal of water from a substrate. Exemplary drying agents include alcohols, ketones, fluorocarbons, chlorocarbons, and other materials miscible with water. For example, drying agents may include one or more compounds including acetone, isopropyl alcohol, perfluorohexane, and engineered fluids including Novec™ 7100 and Novec™ 7000, produced by the 3M Company of Maplewood, Minn. Drying agents which are immiscible with water may be preceded by a rinse agent or a series of rinse agents in order to remove water, and at the end of the series, leave a surface coated in a material which is miscible with the drying agent, which may be used to remove the final rinse agent. This may be performed when water is the initial rinse agent and a water immiscible fluid such as Novec™ 7100 is to be used as the drying agent. The drying agents may be characterized by a surface tension at about 21° C. of less than or about 75 mN/m, less than or about 70 mN/m, less than or about 65 mN/m, less than or about 60 mN/m, less than or about 55 mN/m, less than or about 50 mN/m, less than or about 45 mN/m, less than or about 40 mN/m, less than or about 35 mN/m, less than or about 30 mN/m, less than or about 25 mN/m, less than or about 20 mN/m, less than or about 15 mN/m, less than or about 10 mN/m, less than or about 5 mN/m, less than or about 1 mN/m, between about 1 mN/m and about 30 mN/m, between about 10 mN/m and about 25 mN/m, or any other value or internal range included within these listed ranges. For example, isopropyl alcohol may be utilized as the drying agent and may be characterized by a surface tension at about 21° C. of about 23 mN/m.

In one example drying process encompassed by the present technology, water was removed from a substrate using isopropyl alcohol. The substrate had a plurality of trenches etched within its surface that were characterized by a 26 nm gap between vertical structures, and an aspect ratio of about 21. The isopropyl alcohol drying agent was applied to the substrate to remove residual water. Sufficient isopropyl alcohol was applied to wet the substrate and trenches. The isopropyl alcohol was applied to a level above the height of the trenches, and a continuous layer of isopropyl alcohol developed above a height of the trenches and remained along an upper surface of the substrate. The substrate was placed in a chamber that was sealed.

The chamber was heated to develop a vapor-liquid equilibrium of the isopropyl alcohol within the chamber. It was noted that liquid isopropyl alcohol remained within the chamber and along the substrate surfaces. Heat was continued to be applied to the chamber to raise the temperature above approximately 100° C., which provided a corresponding chamber pressure of roughly 30 psi. The calculated surface tension of isopropyl alcohol at those conditions was approximately 13 mN/m. The chamber was vented evaporating the drying agent, and the dry substrate was imaged. No deformation or pattern collapse occurred, and the process results were repeatable.

The surface tension of the isopropyl alcohol at venting conditions was determined to be in a similar range as the engineered fluid Novec™ 7100, which has a surface tension at 25° C. and atmospheric pressure of approximately 13.6 mN/m. Because surface tension was determined to exhibit effects on the substrate features in various experiments, an example process was performed with Novec™ 7100. In the process, a substrate having similar characteristics as the one discussed above in the example relating to isopropyl alcohol was used. After a water rinse, followed by an isopropyl alcohol rinse, Novec™ 7100 was applied in a similar fashion as the isopropyl alcohol of the previous example. The device was allowed to dry at 25° C. The substrate was imaged, and feature deformation and pattern collapse had occurred.

Without being bound to any particular theory, a discussion of possible mechanisms may aid in understanding of the results of the two experiments. As previously noted, surface tension of rinsing agents and drying agents apply forces on features. The materials from which the features are formed has a natural resistance to stress, although this resistance is relatively low. For example, as illustrated in FIG. 3, the chart shows different fluid surface tension properties with respect to a deflection from vertical of a feature according to embodiments of the present technology. Line 305 shows the restoring force of a silicon feature that may comprise a line defining a sidewall of a trench. The feature may be similar to the example structures having trenches of roughly 26 nm gap width and aspect ratios of about 21. The skilled artisan will readily understand that different feature sizes are similarly encompassed by the present technology, and that higher aspect ratios, and thinner features may be capable of withstanding even lower opposing forces. The other lines illustrate the force applied by surface tension of individual fluids on features with which they are contacted. For example, line 310 illustrates the surface tension force applied by isopropyl alcohol, line 315 illustrates the surface tension force applied by Novec™ 7100, line 320 illustrates the surface tension force applied by Novec™ 7000, and line 325 illustrates the surface tension force applied by perfluorohexane. Line 330 illustrates the surface tension force applied by supercritical $CO_2$. Accordingly, mathematical modeling estimates that the exemplary features and structures would be capable of withstanding the force applied by surface tension of only supercritical $CO_2$, exhibiting a surface tension at 25° C. of less than 1 mN/m. This result would further be supported by the results of the example test performed utilizing Novec™ 7100 at 25° C. as described above.

Figure 4:
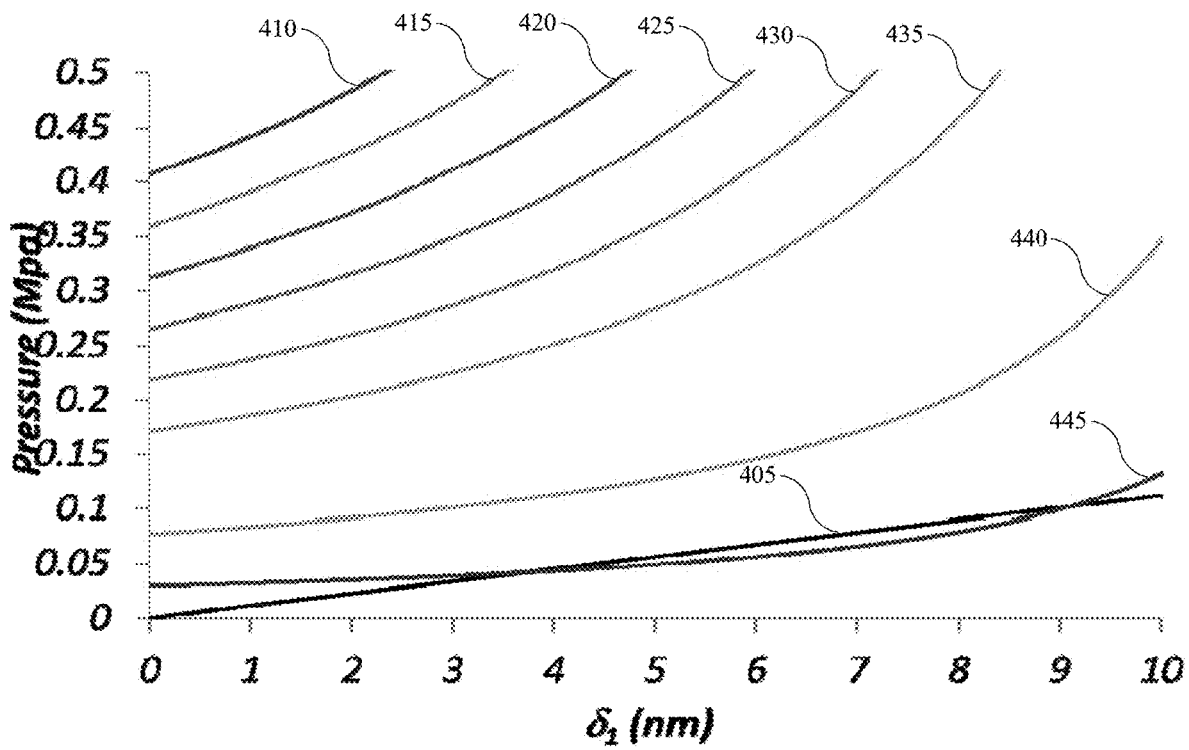
FIG. 4 shows a chart illustrating the effect of temperature on surface tension of isopropyl alcohol according to embodiments of the present technology.

As previously noted, temperature is inversely proportional to surface tension, and thus raising the temperature of drying agents may reduce the surface tension. FIG. 4 shows a chart illustrating the effect of temperature on surface tension of isopropyl alcohol according to embodiments of the present technology. Similar to FIG. 3, line 405 illustrates the restoring force of a similar silicon feature as described previously. The chart shows that as temperature increases, the surface temperature and related force applied by the fluid reduces. Line 410 illustrates the surface tension and exerted pressure of isopropyl alcohol at 25° C., line 415 illustrates the surface tension and exerted pressure of isopropyl alcohol at 50° C., line 420 illustrates the surface tension and exerted pressure of isopropyl alcohol at 75° C., line 425 illustrates the surface tension and exerted pressure of isopropyl alcohol at 100° C., line 430 illustrates the surface tension and exerted pressure of isopropyl alcohol at 125° C., line 435 illustrates the surface tension and exerted pressure of isopropyl alcohol at 150° C., line 440 illustrates the surface tension and exerted pressure of isopropyl alcohol at 200° C., line 445 illustrates the surface tension and exerted pressure of isopropyl alcohol at 225° C. Accordingly, modeling would again suggest that the temperature of isopropyl alcohol should be roughly 225° C. or more to reduce the surface tension sufficiently to produce tension forces below the restoring forces of the feature to which it is contacted.

However, because acceptable results demonstrating no pattern collapse with isopropyl alcohol were produced, additional mechanisms related to the drying process may be involved. Put another way, surface tension characteristics alone would limit the acceptable drying agents to those exhibiting forces below the restoring forces of the structure wetted with the drying agent. Accordingly, as feature size reduces as devices scale below 20 nm, the available drying agents that would not impart deformation may be limited to supercritical fluid processes. Instead, the inventors have determined that by performing processes similar to those discussed throughout this disclosure, many more fluids may be used in drying operations without causing deformation or pattern collapse.

Pattern collapse may follow deformation depending on the exerted stresses on the walls of a trench. Deformation may not fully cause pattern collapse, for example, and may result in wall or structure deflection that does not result in adjacent structures contacting one another. Generally, pattern collapse may occur if the cohesive force, such as the surface tension induced forces, exceed the restoring force, such as the internal stresses of the material, or if the deflection is to an extent that adjacent structures contact. In some situations, adjacent structures may not fully collapse even while deformation occurs. Instead, a wall or structure may reach an equilibrium deflection where the cohesive forces and restoring forces are equal. Accordingly, in some embodiments a certain amount of deformation may occur during the processes, while pattern collapse may not occur. As the described evaporation of the drying agent occurs, the cohesive forces enacted on the structure may diminish, which may cause the deflection to diminish as well. Thus, deformation may occur in embodiments during the heating process to an extent less than half the distance between two adjacent structures, and may occur up to about 5 Å, 1 nm, 2 nm, 3 nm, 4 nm, 5 nm, or greater but less than the full distance or half the distance between two adjacent structures.

The way in which a drying agent is vaporized may impact whether feature collapse occurs. Without binding the claims, a possible mechanism relates to performing the drying process along the boiling point curve of the drying agent. As explained with reference to method 200, the chamber housing the substrate may be heated to create a vapor-liquid equilibrium of the drying agent within the chamber. Continuing to heat the chamber may further lower the surface tension of the liquid fraction of the drying agent. As the temperature is increased within the chamber, the pressure similarly increases, and the vapor-liquid equilibrium of the drying agent is maintained along the boiling point curve for the drying agent.

Because the drying agent is maintained at its boiling point, when the chamber is vented the reduction in pressure may cause an immediate vaporization of the drying agent. Although the vaporization will cause the temperature to begin to drop within the chamber, by continuing to vent the chamber, the drying agent may evaporate the entire liquid fraction as it follows the boiling point curve of the fluid back to atmospheric conditions. Because the pressure drop may be rapid as the chamber is exposed to atmospheric conditions, the drying agent vaporization may be uniform throughout the chamber, and within features of the substrate. Indeed, flash vaporization may occur throughout the liquid fraction depending on the extent to which the pressure is reduced.

Additionally, the rapid vaporization may additionally overcome the meniscus pressure effect explained above. Again, as the fluid level drops below the height of the trenches, a meniscus will typically form within each trench for the drying agent fluid being used. As the meniscus forms, the pressure drop across the meniscus increases due to the Laplace and surface tension pressure effects explained above. However, when the drying agent is at saturation within the chamber at the boiling point of the drying agent, this pressure drop caused by a forming meniscus may induce concomitant boiling at the same location. Accordingly, the boiling may counteract the pressure drop and prevent the formation of a meniscus as the fluid is removed from the chamber. In this way, the forces imparted on the substrate features may be reduced and may be maintained below the restoring force of the materials defining the features. Additionally, deviations in liquid level between adjacent features may not cause deformation or pattern collapse, as the pressure exerted from each side of the feature has been reduced.

Figure 5:
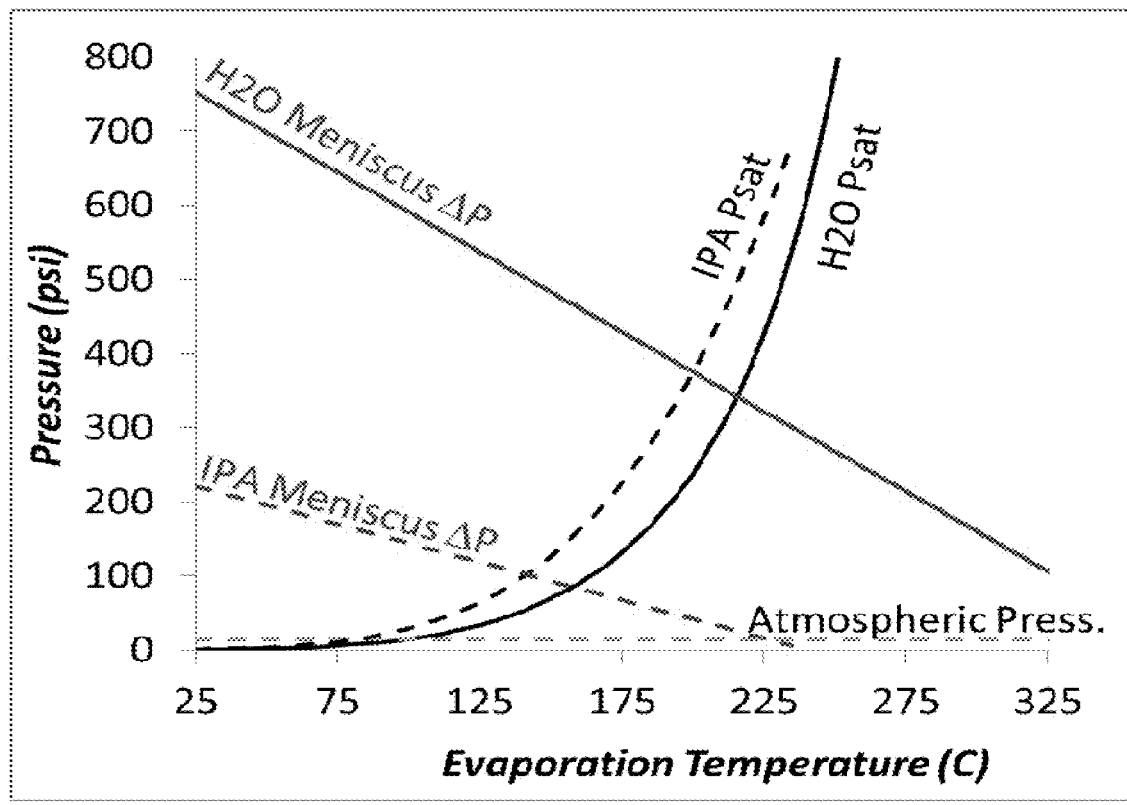
FIG. 5 shows a temperature-pressure chart illustrating the pressure differential across a meniscus for isopropyl alcohol and water, along with their saturation pressures according to embodiments of the present technology.

Turning to FIG. 5 is shown a temperature-pressure chart illustrating the pressure differential across a meniscus for isopropyl alcohol and water, along with their saturation pressures. As illustrated, aside from reducing surface tension of the drying agent, the ability to overcome the meniscus forces utilizing the described processes may further explain certain benefits of the present technology. The processes described may allow the use of fluids with higher surface tensions as drying agents, because the controlled vaporization of the fluids may overcome the issues noted by the modeling of surface tension alone. By potentially counteracting the formation of a meniscus within the substrate features as the drying agent is removed, feature distortion from relatively higher surface tension fluids may be avoided. The forces that may be imparted by the vaporization of fluid at the forming meniscus may off-set the surface tension of the bulk liquid acting to deform the feature inwardly towards the fluid. In this way, a distortion-free drying process may be performed despite that the drying agent may be characterized by a surface tension conventionally expected to cause feature distortion or pattern collapse. By performing the processes of the present technology, pattern deformation may be avoided with many fluids typically used in drying operations.

Additionally, and as further illustrated in FIG. 5, the effects of pressure drop along the boiling point curve of a drying agent may be utilized in a similar fashion below atmospheric conditions. Method 200 may be premised on a process of raising the temperature of a drying agent above its boiling point within a pressure-sealed chamber, which will increase the chamber pressure. The pressure may then be reduced through venting, which will cause the vaporization of the fluid as the conditions return to atmospheric. Conversely, in a chamber containing a substrate and a vapor-liquid saturated drying agent, the pressure may be reduced below atmospheric conditions along the same boiling point curve under vacuum conditions to produce the same effects described above.

Figure 6:
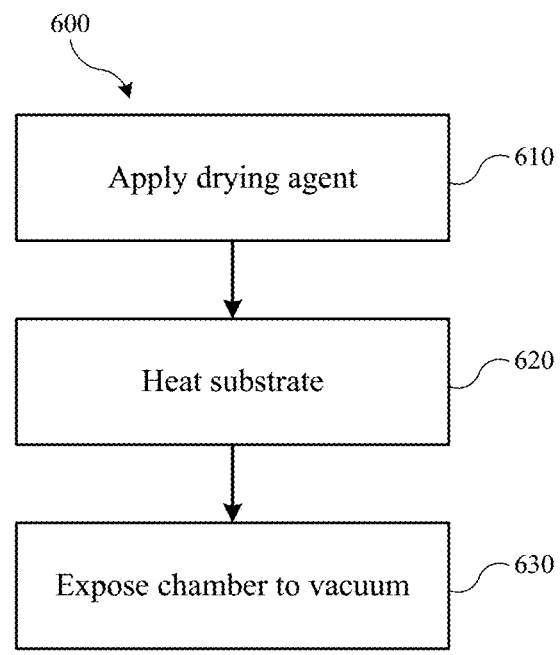
FIG. 6 shows a method of drying a semiconductor substrate according to embodiments of the present technology.

FIG. 6 shows a method 600 of drying a semiconductor substrate according to embodiments of the present technology. As illustrated, and described previously, the substrate may define a number of features that have been formed and cleaned. A cleaning or rinsing operation may have been performed prior to the method 600. At operation 610, a drying agent may be applied to the substrate to remove any other fluids as discussed above. Application of the drying agent may be similar to operation 210 of method 200, and may include any of the materials discussed with respect to that that process.

The drying agent may be applied within a chamber, or may be applied prior to placing the substrate within a chamber. The chamber may be sealed, and at optional operation 620, heat may be applied to the chamber to develop equilibrium between liquid and vapor phases of the drying agent. The heating, amount of drying agent applied, and chamber volume may all be determined to maintain at least a portion of the drying agent in liquid form. In embodiments, the heating may be minimal and performed only to form the vapor-liquid equilibrium. For example, the temperature may be raised to below or about 100° C., and may be raised to below or about 90° C., 80° C., 70° C., 60° C., 50° C., 45° C., 40° C., 35° C., 30° C., or 25° C. in embodiments. In some embodiments, heat may not be applied to the chamber as a vapor-liquid equilibrium may suitably form at atmospheric conditions.

The chamber may be exposed to vacuum at operation 630, which may evaporate and purge the drying agent from the chamber. Similarly to the method 200, the reduction in pressure from the boiling point curve may induce vaporization including flash boiling of the liquid fraction of the drying agent. The vacuum may reduce the pressure within the chamber to an amount below atmospheric conditions including below or about 500 Torr, below or about 400 Torr, below or about 300 Torr, below or about 200 Torr, below or about 100 Torr, below or about 50 Torr, below or about 10 Torr, below or about 1 Torr, or below or about 100 mTorr in embodiments. The vacuum may be applied over a period of time similar to the times discussed above with regard to the venting operations of method 200. The amount of vacuum may be based on the amount of fluid to be removed and the temperature within the vessel, as the reduction in pressure will continue to cool the chamber temperature. Optional operations may be performed including purging the chamber as described above, or returning the chamber to atmospheric conditions via a venting operation, or by supplying a gas to the chamber. In other embodiments, the chamber may be actively heated following the processes as well to limit additional moisture intrusion, or for subsequent processing operations. The same processes counteracting the formation of a meniscus may be employed, as the mechanisms by which the drying agent is removed are the same as with method 200, except that they are performed below atmospheric conditions. An advantage of the vacuum evaporation of the drying agent is that potentially volatile or flammable drying agents may be employed without safety concerns associated with increased temperature and pressures.

The described technology uses drying operations based on the pressure induced evaporation of drying agents at vapor-liquid equilibrium. Unexpectedly, and advantageously, these processes allow the use of drying agents that have been conventionally and experimentally modeled to cause pattern collapse at many conditions based on their inherent surface tension. The described processes may provide additional avenues for drying operations and materials that may be utilized as drying agents as feature sizes reduce with future device scaling.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included. Where multiple values are provided in a list, any range encompassing or based on any of those values is similarly specifically disclosed.

As used herein and in the appended claims, the singular forms "a", "an", and "the" include plural references unless the context clearly dictates otherwise. Thus, for example, reference to "a material" includes a plurality of such materials, and reference to "the agent" includes reference to one or more agents and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A method of drying a semiconductor substrate, the method comprising:
    applying a drying agent to a semiconductor substrate, wherein the drying agent wets the semiconductor substrate;
    pressure-sealing the semiconductor substrate within the chamber;
    heating the chamber housing the semiconductor substrate to a temperature above an atmospheric pressure boiling point of the drying agent until vapor-liquid equilibrium between liquid and vapor phases of the drying agent is reached within the chamber; and
    venting the chamber, wherein the venting vaporizes the drying agent liquid phase from the semiconductor substrate.

2. The method of drying a semiconductor substrate of claim 1, further comprising:
    heating the chamber housing the semiconductor substrate, the heating causing vapor and liquid phases of the drying agent to reach equilibrium of vapor partial pressure and liquid saturation pressure; and
    continuing to heat the chamber housing the semiconductor substrate to a temperature of at least about 100° C.

3. The method of drying a semiconductor substrate of claim 1, wherein the drying agent is miscible with water.

4. The method of drying a semiconductor substrate of claim 3, wherein the drying agent comprises isopropyl alcohol.

5. The method of drying a semiconductor substrate of claim 1, wherein the semiconductor substrate comprises patterned features having an aspect ratio greater than 5, and wherein the drying agent wets the patterned features completely.

6. The method of drying a semiconductor substrate of claim 1, wherein applying the drying agent fully displaces water from the semiconductor substrate.

7. The method of drying a semiconductor substrate of claim 6, wherein applying the drying agent comprises one or more operations fully displacing any fluid except for the drying agent from the semiconductor substrate.

8. The method of drying a semiconductor substrate of claim 1, wherein the heating is performed by:
hermetically closing the chamber with the semiconductor substrate including the applied drying agent housed within the chamber;
heating the chamber causing equilibrium to be reached between the drying agent liquid and vapor phases; and
heating the chamber to the temperature above the atmospheric pressure boiling point of the drying agent.

9. The method of drying a semiconductor substrate of claim 1, further comprising purging the chamber with an inert precursor subsequent the venting.

10. A method of drying a semiconductor substrate, the method comprising:
applying a drying agent to the semiconductor substrate within a chamber, wherein the drying agent wets the semiconductor substrate;
sealing the chamber;
heating the chamber in which the semiconductor substrate is housed to cause an equilibrium to be reached between liquid and vapor phases of the drying agent, wherein the heating maintains at least a portion of the drying agent in a liquid form; and
exposing the chamber to vacuum conditions, wherein the vacuum conditions evaporate and purge the drying agent from the chamber.

11. The method of drying a semiconductor substrate of claim 10, wherein heating the chamber is performed to a temperature below about 150° C.

12. The method of drying a semiconductor substrate of claim 10, further comprising:
subsequent exposing the chamber to vacuum, venting the chamber to atmospheric conditions.

13. The method of drying a semiconductor substrate of claim 12, further comprising:
purging the chamber with air or an inert gas.

14. The method of drying a semiconductor substrate of claim 10, wherein the drying agent comprises isopropyl alcohol or acetone.

15. The method of drying a semiconductor substrate of claim 10, wherein exposing the chamber to vacuum conditions comprises reducing the pressure within the chamber from atmospheric conditions to a pressure of less than about 100 Torr.

16. The method of drying a semiconductor substrate of claim 15, wherein reducing the pressure within the chamber occurs in a time period of less than about 5 minutes.

17. The method of drying a semiconductor substrate of claim 1, wherein heating the chamber includes increasing the temperature within the chamber and maintaining the vapor-liquid equilibrium of the drying agent along a boiling point curve for the drying agent.

18. The method of drying a semiconductor substrate of claim 1, wherein venting the chamber includes reducing the pressure within the chamber to reduce surface tension of the drying agent and to overcome meniscus forces.

19. The method of drying a semiconductor substrate of claim 1, wherein the drying agent is characterized by a surface tension of less than about 25 mN/m at about 21° C.

20. The method of drying a semiconductor substrate of claim 10, wherein exposing the chamber to vacuum conditions includes reducing the pressure within the chamber below atmospheric conditions along a boiling point curve for the drying agent.

* * * * *